Nov. 5, 1974 W. N. JACOBUS, JR., ET AL 3,846,193

MINIMIZING CROSS-TALK IN LED. ARRAYS

Filed June 22, 1972

United States Patent Office 3,846,193
Patented Nov. 5, 1974

3,846,193

MINIMIZING CROSS-TALK IN L.E.D. ARRAYS

William N. Jacobus, Jr., Essex Junction, Vt., and San-Mei Ku, Poughkeepsie, N.Y., assignors to International Business Machines Corporation, Armonk, N.Y.

Filed June 22, 1972, Ser. No. 265,122
Int. Cl. H01l 7/44
U.S. Cl. 148—187 13 Claims

ABSTRACT OF THE DISCLOSURE

Disclosed is a semiconductor light emitting diode (LED) array in which "cross-talk" between adjacent diodes in the array is minimized. The disclosed LED arrays have an absorbing layer on the backside of the devices and/or a guard ring region surrounding each device in order to absorb spurious reflections within the semiconductor crystal. Disclosed also is a method of making improved light emitting diodes (LED's).

CROSS REFERENCE TO RELATED APPLICATIONS OR PATENTS

Application Ser. No. 200,438, filed Nov. 19, 1971, by the same inventors and assignee as the present application, now Pat. 3,817,798.

BACKGROUND OF THE INVENTION

1. Field of the Invention

This invention relates to light emitting diode (LED) arrays and more particularly to the minimizing of "cross-talk" between adjacent diodes in a LED array.

2. Description of the Prior Art

Where a plurality of light emitting PN junctions are formed on a monolithic array chip, part of the light generated by each PN junction is normally transmitted through the bulk of the chip and reflected from the backside thereof. The reflected light passes back through the bulk and leaves the top side of the chip at another part of the array. This undesirable reflected signal has been referred to as "cross-talk." Such cross-talk limits the closeness of the spacing between adjacent LED's.

SUMMARY OF THE INVENTION

It is accordingly a primary object of this invention to minimize the cross-talk between light emitting diodes.

It is another object of this invention to closely space light emitting devices.

It is a further object of this invention to fabricate improved LED arrays without additional process steps.

The closely spaced diode arrays of this invention are generally formed in accordance with the teachings of the aforementioned Pat 3,817,798. In that application, a light emitting diode array was formed in an N type doped gallium arsenide substrate. Zinc was diffused through a thin silicon dioxide ($SiO_2$) layer to form a P type region within said N type substrate. The masking of the zinc diffusant was performed by a selectively etched layer of silicon nitride ($Si_3N_4$).

In the present invention, during the P type diffusion step, the zinc is also diffused into the back of the gallium arsenide wafer. The diffusion into the backside of the wafer is more concentrated since it does not have to pass through a thin layer of silicon dioxide. It was found that the PN junction formed by this diffused P layer absorbs light that was previously reflected from the backside of the wafer, thereby minimizing cross-talk.

In accordance with another aspect of this invention, it was further found that a guard ring could be diffused into the top surface of the wafer also during the same step as the previously described diffusions. In order to diffuse a guard ring deeper than the light emitting junction, the diffusion step is preceded by a selective etching of the silicon dioxide ($SiO_2$) layer. This permits the guard ring to be diffused as deep as the diffusion into the back surface of the wafer.

The foregoing and other objects, features and advantages of this invention will be apparent from the following more particular description of the preferred embodiments of the invention, as illustrated in the accompanying drawings.

DESCRIPTION OF THE PREFERRED EMBODIMENTS

Figure 1:
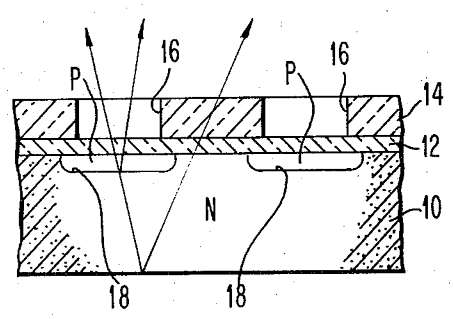
FIG. 1 is a fragmentary section of a closely spaced light emitting diode array without the cross-talk eliminating feature.

Referring to FIG. 1, there is disclosed a fragmentary section of a light emitting diode array fabricated in accordance with the aforementioned Pat. 3,817,798. The drawings and specification of this aforementioned patent are hereby incorporated herein by reference. A substrate 10 of gallium arsenide doped with an N type impurity from a group of elements consisting of tin, tellurium, selenium, etc., for example, is coated with a thin oxide layer 12 of silicon dioxide ($SiO_2$). The layer 12 should consist of material relatively transparent to the subsequent diffusion of a desired impurity. Layer 14 consisting of silicon nitride ($Si_3N_4$), for example, being impervious to a subsequent diffusion of impurities is deposited over the layer 12. Layer 14 is then selectively etched, preferably by hot phosphoric acid which will open windows 16 in those areas where light emitting devices are desired. The etchant preferably will etch away the silicon nitride layer 14 without significantly attacking the layer 12. Diffusion of the P type impurity such as zinc for example provides a light emitting PN junction 18.

FIG. 1 further shows how the light rays generated at the PN junction 18 are reflected from the backside of the substrate 10 and pass through the front side at points other than through windows 16. This phenomenon has previously been referred to as cross-talk and is undesirable.

Figure 2:
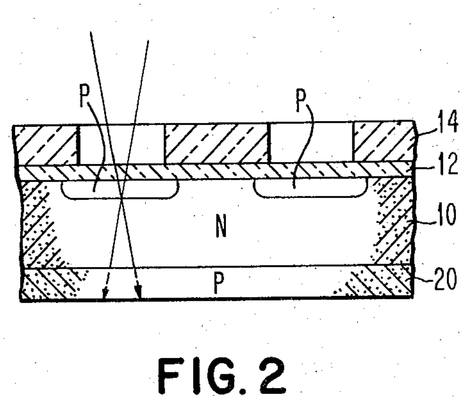
FIG. 2 is a fragmentary section of a light emitting diode array having a light absorbing region on the back surface.

Refer now to FIG. 2 where the cross-talk has been minimized in accordance with one aspect of the invention. Corresponding portions of the fragmentary view of the light emitting diode array have been correspondingly numbered. It is noted that a P type impurity layer 20 has been diffused into the backside of substrate 10. Since the backside of substrate 10 does not have a layer 12 deposited thereon, the P type diffusion 20 is 3 to 4 times deeper than the junction 18, assuming that all diffusions are performed simultaneously in a single step. Thus, assuming a substrate thickness of approximately 10 mils, the junction depth 18 can be approximately 5 to 10 microns while the backside diffusion depth is in the range of from 1 to 1.5 mils. Note that 25 microns equals 1 mil. The backside surface concentration $C_0$ will then be approximately equal to $4–5\times10^{20}/cm.^3$. A diffusion source preferred to pure zinc is a zinc doped gallium arsenide source as described in IBM Technical Disclosure Bulletin Vol. 14, No. 8, January 1972, pages 2529–30.

Figure 3:
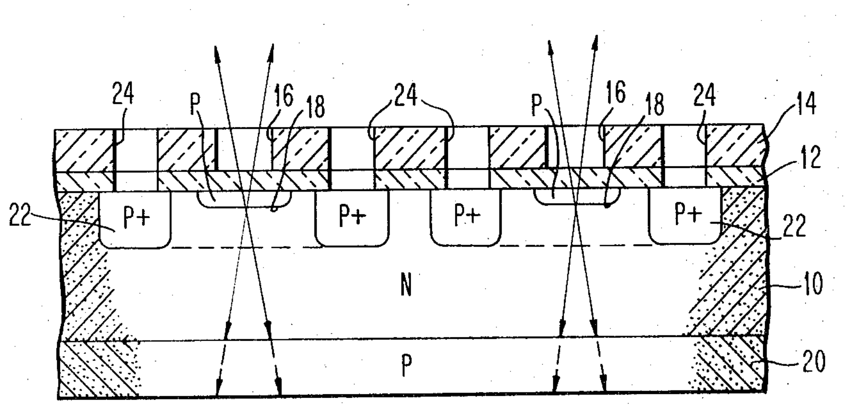
FIG. 3 is a fragmentary view of a light emitting diode array showing a guard ring-like absorbing region as well as a light absorbing region on the back (bottom) surface of the wafer.

Refer now to FIG. 3 for a still further aspect of our invention. This figure has been numbered in the same manner as preceding figures insofar as practical. In addition to the drawing of FIG. 2, FIG. 3 further shows diffused guard rings 22. These guard rings tend to minimize spurious reflections and can be used alone or in combination with the backside diffusion 20. An additional advantage of guard ring 22 is that it further isolates individual light emitting diodes in the array. The formation of the guard ring 22 requires the additional method step of etching away oxide layer 12 to provide openings 24. All diffusions take place simultaneously so that the concentration and depth of the diffusion of guard rings 22 is the same as that for backside diffused region 20.

Figure 4:
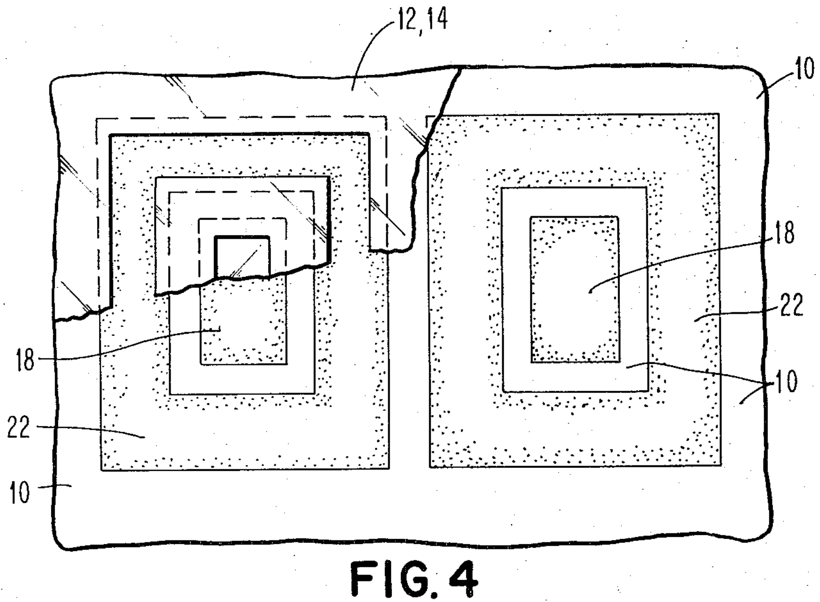
FIG. 4 is a partially cut-away top view of FIG. 3.

Refer now to FIG. 4 which is a top view of FIG. 3. Corresponding elements have again been correspondingly numbered. The top view clearly shows the heavily doped P type guard ring region surrounding each light emitting device. Note that in FIG. 4, the guard ring is shown surrounding each device. Of course, the guard ring could be applied in a grid like pattern resulting in more closely spaced devices with only a single region of heavily doped P type material between devices.

In the foregoing description of the preferred embodiment, gallium arsenide (GaAs) having either [100] or [110] orientation was described. Those skilled in the art will readily recognize that our invention is equally applicable to all types of Group III–V semiconductors and mixed compounds from the Group III–V semiconductors. Also, instead of a substrate that is medium doped with N type impurity with a P type active region, the opposite conductivity types would be a mere substitution to those skilled in the art. If a different orientation crystal such as [111] is to be used, then it must be recognized that one planar face of the crystal would always be composed of arsenic atoms while the other surface is composed of gallium atoms. In this case, it is desirable to diffuse devices into the planar surface having arsenic atoms at the surface because of a faster diffusion of devices into arsenic than gallium.

Devices fabricated in accordance with our invention can be rectangular measuring 4 mils by 5 mils and producing approximately 250 microwatts. Each of the disclosed techniques (i.e. backsde diffusion and guard ring) reduce the top surface emission due to backside reflection (cross-talk) by a factor of $10^{-3}$.

While the invention has been particularly shown and described with reference to preferred embodiments thereof, it will be understood by those skilled in the art that the foregoing and other changes in form and detail may be made therein without departing from the spirit and scope of the invention.

We claim:

1. A process for the forming of an array of closely spaced light emitting devices comprising the steps of:

providing a semiconductor substrate having two major surfaces and selected from the group consisting of III–V elements doped with an impurity of n-conductivity type;

depositing a first layer of a first material on a first major surface of said substrate, said material adhering well to the said first surface of said substrate, said material being substantially transparent to the diffusion of an impurity of a p-conductivity type;

depositing a second layer of a second material on said first layer, said material being substantially impervious to the diffusion of an impurity of the p-conductivity type;

forming windows in said second layer;

diffusing an impurity of the p-conductivity type through said windows in said second layer and through said first layer; and forming a light absorbing background by diffusing an impurity of said p-conductivity type into the second surface of said substrate.

2. Method as in claim 1 wherein said last mentioned diffusion takes place simultaneously with the said step of diffusing an impurity of the p-conductivity type through said first layer.

3. The method of claim 1 additionally comprising the steps of:

selectively etching windows in said first layer; and forming a light absorbing annular region in said substrate by diffusing an impurity of the said p-conductivity type through said last mentioned etched windows.

4. Method as in claim 3 wherein said last mentioned diffusion step takes place simultaneously with all other aforementioned diffusion steps.

5. Method as in claim 1 wherein said p-conductivity type impurity comprises zinc.

6. A process for the forming of an array of light emitting devices comprising the steps of:

providing a semiconductor substrate having two major surfaces and consisting of mixed compounds from the group consisting of III–V elements and doped with an impurity of n-conductivity type;

depositing a first layer of a first material on a first major surface of said substrate, said material adhering well to the said surface of said substrate, said material being substantially transparent to the diffusion of an impurity of a p-conductivity type;

depositing a second layer of a second material on at least a portion of said first layer, said material being substantially impervious to the diffusion of an impurity of the second conductivity type;

forming windows in said second layer;

diffusing an impurity of the p-conductivity type through said windows in said second layer and through said first layer; and forming a light absorbing background by diffusing an impurity of the said p-conductivity type into the second major surface of said substrate.

7. Method as in claim 6 wherein said last mentioned diffusion takes place simultaneously with the said step of diffusing an impurity of the p-conductivity type through said first layer.

8. The method of claim 6 additionally comprising the steps of:

selectively etching annular windows in said first and second layers; and forming a light absorbing annular region in said substrate by diffusing an impurity of the said p-conductivity type through said last mentioned etched windows.

9. Method as in claim 8 wherein said diffusion step takes place simultaneously with all other aforementioned diffusion steps.

10. Method as in claim 6 wherein said p-conductivity type impurity comprises zinc.

11. A method of forming an array of light emitting devices comprising the steps of:

providing a gallium arsenide semiconductor substrate having two major surfaces and doped with an impurity of n-conductivity type;

depositing a first layer of oxide material on a first major surface of the substrate, said oxide material adhering well to the said surface of said substrate, said material being substantially transparent to a diffusion of an impurity of a p-conductivity type;

depositing a second layer of a material including silicon nitride on at least a portion of said first layer, said silicon nitride material being substantially impervious to the diffusion of an impurity of the p-conductivity type;

etching windows in selected portions of said second layer of material;

etching annular windows in selected portions of both said second layer and said first layer; and diffusing an impurity of the said p-conductivity type through said first layer simultaneously with diffusing an impurity of the p-conductivity type through said windows etched in both said second layer and said first layer, and also diffusing an impurity of the said p-conductivity type into the second major surface of said substrate, thereby providing a light absorbing background in the second surface of the wafer.

12. A process for the forming of an array of closely spaced light emitting devices comprising the steps of:

providing a semiconductor substrate having two major surfaces and including materials from the Group III–V elements doped with an impurity of n-conductivity type;

selectively diffusing an impurity of a p-conductivity type into the first major surface of said substrate, thereby forming light emitting devices; and forming an impurity of said p-conductivity type into the second major surface of said substrate, thereby providing a light absorbing background in the second surface of the wafer.

13. Method as in claim 12 additionally comprising the step of:

forming an impurity of the p-conductivity type surrounding each said light emitting device.

References Cited

UNITED STATES PATENTS

| | | | |
|---|---|---|---|
| 3,508,111 | 4/1970 | Davidson et al. | 317—235 X |
| 3,394,037 | 7/1968 | Robinson | 148—187 |
| 3,586,925 | 9/1968 | Collard | 148—176 X |
| 3,636,617 | 1/1972 | Schmidt et al. | 148—187 X |
| 3,703,669 | 11/1972 | London | 317—235 |

L. DEWAYNE RUTLEDGE, Primary Examiner

J. M. DAVIS, Assistant Examiner

U.S. Cl. X.R.

357—17, 48